United States Patent
Sauber et al.

(10) Patent No.: US 8,063,634 B2
(45) Date of Patent: *Nov. 22, 2011

(54) ELECTRONIC CIRCUIT AND METHOD FOR RESETTING A MAGNETORESISTANCE ELEMENT

(75) Inventors: John Sauber, Millbury, MA (US); William P. Taylor, Amherst, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 568 days.

This patent is subject to a terminal disclaimer.

(21) Appl. No.: 12/183,106

(22) Filed: Jul. 31, 2008

(65) Prior Publication Data
US 2010/0026288 A1 Feb. 4, 2010

(51) Int. Cl.
*G01R 33/02* (2006.01)
(52) U.S. Cl. .......................... 324/252; 324/244; 324/262
(58) Field of Classification Search .................. None
See application file for complete search history.

(56) References Cited

U.S. PATENT DOCUMENTS

| | | | |
|---|---|---|---|
| 4,385,283 A * | 5/1983 | Delapierre | 340/458 |
| 5,247,278 A | 9/1993 | Pant et al. | |
| 5,366,815 A * | 11/1994 | Araki et al. | 428/611 |
| 5,521,501 A | 5/1996 | Dettmann et al. | |
| 5,561,366 A | 10/1996 | Takahashi et al. | |
| 5,686,838 A | 11/1997 | Van den Berg | |
| 5,831,426 A | 11/1998 | Black, Jr. et al. | |
| 6,071,655 A | 6/2000 | Faulconer | |
| 6,094,330 A | 7/2000 | Criniti et al. | |
| 6,316,931 B1 | 11/2001 | Nakagawa et al. | |
| 6,323,634 B1 | 11/2001 | Nakagawa et al. | |
| 6,411,078 B1 | 6/2002 | Nakagawa et al. | |
| 6,424,018 B1 | 7/2002 | Ohtsuka | |
| 6,429,640 B1 | 8/2002 | Daughton et al. | |
| 6,433,981 B1 | 8/2002 | Fletcher et al. | |
| 6,445,171 B2 | 9/2002 | Sandquist et al. | |
| 6,462,531 B1 | 10/2002 | Ohtsuka | |
| 6,544,078 B2 | 4/2003 | Palmisano et al. | |

(Continued)

FOREIGN PATENT DOCUMENTS

DE 10017374 B4 12/2000

(Continued)

OTHER PUBLICATIONS

U.S. Final Office Action dated Dec. 3, 2010 for U.S. Appl. No. 12/183,541; 16 pages.

(Continued)

*Primary Examiner* — Jermele M Hollington
*Assistant Examiner* — Trung Nguyen
(74) *Attorney, Agent, or Firm* — Daly, Crowley, Mofford & Durkee, LLP

(57) ABSTRACT

An electronic circuit includes a primary magnetoresistance element for providing a first output signal proportional to a magnetic field. The primary magnetoresistance element has a primary maximum response axis. The primary magnetoresistance element also has a hysteresis characteristic. The electronic circuit also includes a reset conductor disposed proximate to the magnetoresistance element. The electronic circuit also includes a secondary magnetic field sensing element for providing a second output signal proportional to a magnetic field. The secondary magnetic field sensing element has a secondary maximum response axis, which, in some embodiments, is substantially perpendicular to the primary maximum response axis. In operation, the primary magnetoresistance is reset in accordance with an excessive magnetic field sensed by the secondary magnetic field sensing element.

23 Claims, 4 Drawing Sheets

U.S. PATENT DOCUMENTS

| | | | |
|---|---|---|---|
| 6,566,856 B2 | 5/2003 | Sandquist et al. | |
| 6,583,629 B1 | 6/2003 | Stokes | |
| 6,642,705 B2 | 11/2003 | Kawase | |
| 6,667,682 B2 | 12/2003 | Wan et al. | |
| 6,683,448 B1 | 1/2004 | Ohtsuka | |
| 6,759,841 B2 | 7/2004 | Goto et al. | |
| 6,791,313 B2 | 9/2004 | Ohtsuka | |
| 6,812,687 B1 | 11/2004 | Ohtsuka | |
| 6,841,989 B2 | 1/2005 | Goto et al. | |
| 6,970,333 B2 | 11/2005 | Boeve | |
| 6,975,110 B2 * | 12/2005 | Kaiju et al. | 324/252 |
| 6,989,665 B2 | 1/2006 | Goto | |
| 6,955,315 B2 | 2/2006 | Sharma et al. | |
| 7,166,807 B2 | 1/2007 | Gagnon et al. | |
| 7,248,045 B2 | 7/2007 | Shoji | |
| 7,259,545 B2 | 8/2007 | Stauth et al. | |
| 7,336,064 B2 | 2/2008 | Ludwig et al. | |
| 7,495,624 B2 | 2/2009 | Daalmans | |
| 7,518,354 B2 | 4/2009 | Stauth et al. | |
| 7,598,601 B2 | 10/2009 | Taylor et al. | |
| 7,709,754 B2 | 5/2010 | Doogue et al. | |
| 7,746,056 B2 | 6/2010 | Stauth et al. | |
| 7,816,905 B2 | 10/2010 | Doogue et al. | |
| 7,936,164 B2 | 5/2011 | Doogue et al. | |
| 7,973,527 B2 | 7/2011 | Taylor et al. | |
| 2002/0180431 A1 | 12/2002 | Torok et al. | |
| 2006/0071655 A1 | 4/2006 | Shoji | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0170529 A1 | 8/2006 | Shoji | |
| 2006/0291106 A1 | 12/2006 | Shoji | |
| 2007/0044370 A1 | 3/2007 | Shoji | |
| 2007/0076332 A1 | 4/2007 | Shoji et al. | |
| 2007/0090825 A1 | 4/2007 | Shoji | |
| 2007/0096716 A1 | 5/2007 | Shoji | |
| 2007/0188946 A1 | 8/2007 | Shoji | |
| 2009/0212765 A1 | 8/2009 | Doogue et al. | |
| 2009/0315543 A1 | 12/2009 | Guo et al. | |
| 2010/0001715 A1 | 1/2010 | Doogue et al. | |
| 2010/0026288 A1 | 2/2010 | Sauber et al. | |
| 2010/0026289 A1 | 2/2010 | Taylor et al. | |

FOREIGN PATENT DOCUMENTS

| | | |
|---|---|---|
| DE | 10159607 A1 | 9/2002 |
| DE | 10128150 C1 | 1/2003 |
| DE | 10155423 B4 | 5/2003 |
| DE | 10202287 C1 | 8/2003 |
| DE | 10222395 A1 | 12/2003 |
| DE | 102004003369 A1 | 8/2005 |
| DE | 102004009267 B3 | 9/2005 |
| DE | 102004038847 B3 | 9/2005 |
| DE | 102004040079 B3 | 12/2005 |
| DE | 102005037905 A1 | 3/2006 |
| DE | 102004053551 A1 | 5/2006 |
| DE | 102006008257 A1 | 10/2006 |
| DE | 102006021774 A1 | 1/2007 |
| DE | 102005038655 B3 | 3/2007 |
| DE | 102005040539 B4 | 3/2007 |
| DE | 10 2005 037 036 A1 | 4/2007 |
| DE | 10 2005 037 036 B4 | 4/2007 |
| DE | 102005052688 A1 | 5/2007 |
| DE | 102006007770 A1 | 8/2007 |
| DE | 102006028698 B3 | 12/2007 |
| DE | 102006046736 B4 | 4/2008 |
| DE | 102006046739 B4 | 8/2008 |
| WO | WO 2006/136577 A1 | 12/2006 |
| WO | WO 2007/147760 A2 | 12/2007 |

OTHER PUBLICATIONS

Office Action dated Jun. 21, 2010 from U.S. Appl. No. 12/183,541.

Taylor et al.; U.S. Appl. No. 12/183,541, filed Jul. 31, 2008.

Taylor et al.; "A Spin-Valve Based SOIC8 Current Sensor;" Allegro MicroSystems, Inc. Manuscript; Revised Aug. 17, 2006; pp. 1-4.

Yamada et al.; "Eddy-Current Testing Probe with Spin-Valve Type GMR Sensor for Printed Circuit Board Inspection:" IEEE Transactions on Magnetics; vol. 40; Jul. 2004; pp. 2676-2678.

Office Action dated Jun. 21, 2010 from U.S. Appl. No. 12/183,541.

Response to Office Action of Jun. 21, 2010 from U.S. Appl. No. 12/183,541.

Response to Office Action dated Dec. 3, 2010 from U.S. Appl. No. 12/183,541, filed Feb. 17, 2011.

Image File Wrapper downloaded on Mar. 28, 2011 for U.S. Appl. No. 12/183,541, filed Jul. 31, 2008, Part 1.

Image File Wrapper downloaded on Mar. 28, 2011 for U.S. Appl. No. 12/183,541, filed Jul. 31, 2008, Part 2.

Image File Wrapper downloaded on Mar. 28, 2011 for U.S. Appl. No. 12/183,541, filed Jul. 31, 2008, Part 3.

Response to Office Action dated Dec. 3, 2010 for U.S. Appl. No. 12/183,541; 13 pages.

Notice of Allowance dated Mar. 11, 2011 for U.S. Appl. No. 12/183,541; 5 pages.

Allegro Microsystems, Inc.; "ACS704 Fully Integrated Hall Effect-Based Linear Current Sensor IC with Voltage Isolation and Low-Resistance Current Conductor;" Data Sheet printed Sep. 19, 2011; http://wvvw.allegromicro.com/en/Products/Part_Numbers/0704/; 1 sheets.

* cited by examiner

ELECTRONIC CIRCUIT AND METHOD FOR RESETTING A MAGNETORESISTANCE ELEMENT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to circuits that use magnetoresistance elements and, more particularly, to a circuit configured to reset a magnetoresistance element to establish operation on a known portion of a hysteresis characteristic.

BACKGROUND OF THE INVENTION

As is known, there are a variety of types of magnetic field sensing elements, including, but not limited to, Hall effect elements, magnetoresistance elements, and magnetotransistors. As is also known, there are different types of Hall effect elements, for example, a planar Hall element, and a vertical Hall element. As is also known, there are different types of magnetoresistance elements, for example, a giant magnetoresistance (GMR) element, an anisotropic magnetoresistance element (AMR), a tunneling magnetoresistance (TMR) element, and a magnetic tunnel junction (MTJ).

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetoresistance elements tend to have a hysteresis characteristic with regard to resistance versus applied magnetic field. Different types of magnetoresistance elements can have different hysteresis characteristics, some of which are described below.

The hysteresis characteristic can result in an uncertainty as to a magnetic field being sensed by the magnetoresistance element. In other words, at different times, the magnetoresistance element can have two different resistances when exposed to the same external magnetic field.

Magnetic field sensors, i.e., circuits that use magnetic field sensing elements, are used in a variety of applications, including, but not limited to, a current sensor that senses a magnetic field generated by a current flowing in a current-carrying conductor, a magnetic switch that senses the proximity of a ferromagnetic object, a rotation detector that senses passing ferromagnetic articles, for example magnetic domains of a ring magnet, and a magnetic field sensor that senses a magnetic field density of a magnetic field.

As is known in the art, a conventional magnetic field sensor, e.g., a current sensor, can be arranged in either an open loop or a closed loop configuration. An "open loop" current sensor includes a magnetic field sensing element in proximity to a current-carrying, or primary, conductor. The current sensor provides an output signal proportional to the magnetic field generated by current passing through the primary conductor.

A "closed loop" current sensor additionally includes a secondary conductor in proximity to the magnetic field sensing element. A current is passed through the secondary conductor in order to generate a magnetic field that opposes and cancels the magnetic field generated by a current passing through the primary conductor. Thus, the magnetic field in the vicinity of the magnetic field sensing element is substantially zero. The current passed through the secondary conductor is proportional to the magnetic field in the primary conductor and thus, to the primary current. The closed loop configuration generally provides improved accuracy over the open loop configuration. This is because the effect of the above-described hysteresis characteristic associated with the magnetic field sensing element, and in particular, associated with a magnetoresistance element, is eliminated in many situations by maintaining the magnetic field on the magnetic field sensing element to be approximately zero. The closed loop configuration also generally provides improved linearity in comparison with the open loop configuration, as well as increased dynamic range.

Though the closed loop arrangement can eliminate the effect of the hysteresis characteristic in many situations, the closed loop arrangement is unable to eliminate the effect of the hysteresis characteristic in some situations. For example, if the magnetic field experienced by the magnetic field sensing element is very large, and large enough that the closed loop arrangement is unable to fully oppose the magnetic field generated by current carried by the primary conductor, then the magnetic field sensing element, and in particular, the magnetoresistance element, may saturate, and the hysteresis characteristic may thereafter result in the above-described uncertainty of the sensed magnetic field.

Furthermore, the above-described closed loop arrangement includes circuit components, for example, amplifiers, which have delay times. Therefore, due to the time delay, a rapid transient in the magnetic field experienced by the magnetic field sensing element may not be fully opposed by the feedback circuit. Thus, in this situation also, the magnetic field sensing element, and in particular, the magnetoresistance element, may saturate, and the hysteresis characteristic may thereafter result in the above-described uncertainty of the sensed magnetic field.

It will be appreciated that a temporary large magnetic field experienced by a magnetoresistance element, which is generally aligned with a maximum response axis of the magnetoresistance element, can saturate the magnetoresistance element, and therefore can cause the above-described uncertainty of a sensed magnetic field thereafter. However, it should also be appreciated that a temporary large magnetic field experienced by a magnetoresistance element, which is generally not aligned with a maximum response axis of the magnetoresistance element, for example, which is perpendicular to the magnetoresistance element, can also cause an offset to the resistance of the magnetoresistance element thereafter, and therefore can cause the above-described uncertainty of a sensed magnetic field.

Various parameters characterize the performance of magnetic field sensors, e.g., current sensors, including sensitivity and linearity. Sensitivity is related to a change in the resistance of the magnetoresistance element or the change in output voltage from the Hall effect element in response to a change in magnetic field. Linearity is related to the degree to which the resistance of the magnetoresistance element or the output voltage from the Hall effect element varies in direct proportion to the magnetic field.

In general, it is known that many types of magnetoresistance elements have a greater sensitivity than a Hall effect element. However, it is also known that many types of magnetoresistance elements have a hysteresis characteristic that can result in a greater uncertainty in a sensed magnetic field than a Hall effect element.

It would be desirable to provide a sensor (e.g., a current sensor) using a magnetoresistance element, and therefore, capable of a relatively high sensitivity, but for which the uncertainty of the sensed magnetic field (e.g., of the sensed current) due to a hysteresis characteristic is reduced.

While current sensors using magnetoresistance elements are described as examples above, it will be appreciated that conventional external magnetic field sensors and also conventional electrical signal isolators that use magnetoresistance elements suffer from the same disadvantages due to the hysteresis characteristic. It would, therefore, also be desirable to provide an external magnetic field sensor and also an electrical signal isolator using a respective magnetoresistance element, and therefore, capable of a relatively high sensitivity, but for which the uncertainty of the sensed magnetic field due to a hysteresis characteristic is reduced.

SUMMARY OF THE INVENTION

The present invention provides a sensor using a magnetoresistance element, and for which an uncertainty of the sensed magnetic field due to a hysteresis characteristic is reduced.

In accordance with one aspect of the present invention, an electronic circuit includes a primary magnetoresistance element for providing a first output signal proportional to a magnetic field. The primary magnetoresistance element has a primary maximum response axis and a hysteresis characteristic. The electronic circuit also includes a reset conductor disposed proximate to the magnetoresistance element. The electronic circuit also includes a secondary magnetic field sensing element for providing a second output signal proportional to a magnetic field. The secondary magnetic field sensing element has a secondary maximum response axis. The electronic circuit also includes a comparison circuit coupled to receive the second output signal, configured to compare the second output signal to a threshold signal, and configured to generate a reset current carried by the reset conductor in response to the comparison. In response to the reset current, the reset conductor is configured to generate a reset magnetic field at the primary magnetoresistance element to temporarily force the magnetoresistance element to a saturation region of the hysteresis characteristic. In some embodiments, the secondary maximum response axis is substantially perpendicular to the primary maximum response axis.

In accordance with another aspect of the present invention, a method of resetting a primary magnetoresistance element having a primary maximum response axis and a hysteresis characteristic includes sensing a magnetic field with a secondary magnetic field sensing element having a secondary maximum response axis, comparing the magnetic field sensed by the secondary magnetic field sensing element to a threshold, and resetting the primary magnetoresistance element with a reset magnetic field in response to the comparing by temporarily forcing the primary magnetoresistance element to a saturation region of the hysteresis characteristic. In some embodiments, the secondary maximum response axis is substantially perpendicular to the primary maximum response axis.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "magnetic field sensing element" is used to describe a variety of electronic elements that can sense a magnetic field. While magnetic field sensing elements are shown and described below to be magnetoresistance elements, in other arrangements, the magnetic field sensing elements can be, but are not limited to, Hall effect elements or magnetotransistors. As is known, there are different types of Hall effect elements, for example, a planar Hall element, and a vertical Hall element. As is also known, there are different types of magnetoresistance elements, for example, a giant magnetoresistance (GMR) element, an anisotropic magnetoresistance element (AMR), a tunneling magnetoresistance (TMR) element, and a magnetic tunnel junction (MTJ).

As used herein, the term "magnetic field sensor" is used to describe a circuit that includes a magnetic field sensing element. Magnetic field sensors are used in a variety of applications, including, but not limited to, a current sensor that senses a magnetic field generated by a current flowing in a current conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Figure 1:
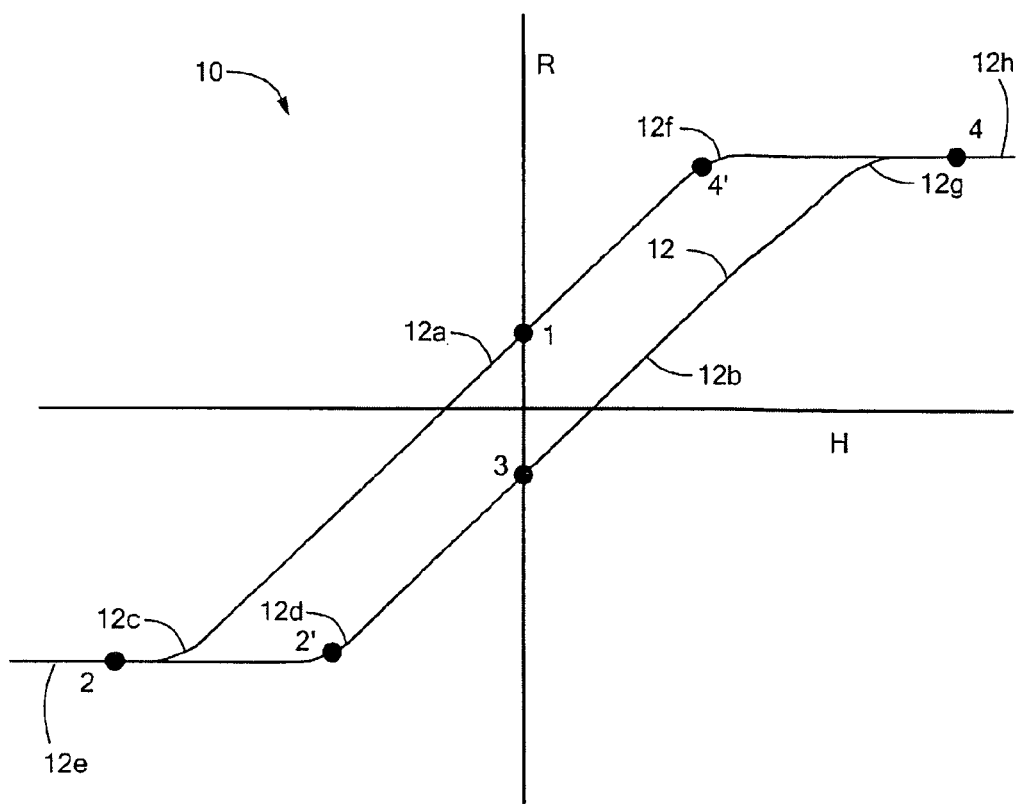
FIG. 1 is a graph showing an exemplary hysteresis characteristic associated with one type of magnetoresistance element.

Referring now to FIG. 1, a graph 10 has a horizontal axis with units of applied magnetic field, or H, which may be provided, for example, in units of Oersteds, and a vertical axis with a scale in units of resistance, or R, which may be provided, for example, in units of Ohms. A curve 12 is representative of a hysteresis characteristic of some types of magnetoresistance elements, for example, giant magnetoresistance elements, for example, a linear spin valve.

The curve 12 has relatively flat saturation regions 12e, 12h, in which the magnetoresistance element associated with the curve 12 experiences high magnetic fields, and relatively straight linear regions 12a, 12b separated from the saturation regions 12e, 12h by transition regions 12c, 12d, 12f, 12g.

As used herein, one end of a transition region, for example, the transition region 12c, occurs at a point at which the transition region 12c has a slope that deviates from the average slope of a saturation region with which is it associated, for example the saturation region 12e, by about five percent. Also as used herein, the other end of the transition region, for example the transition region 12c, occurs at a point at which the transition region 12c has a slope that deviates from the average slope of a linear region with which it is associated, for example, the linear region 12a, by about five percent. Points 2' and 4' are at ends of transition regions 12d, 12f, respectively.

When the magnetoresistance element associated with the curve 12 experiences a nominal (or zero) magnetic field, for example, at the crossing of the two axes, the resistance of the magnetoresistance element can be a resistance represented by either point 1 or point 3. Presuming that the resistance is represented by the point 1, if the magnetic field increases to the right, the magnetoresistance element will achieve a resistance represented by a point 4. If the magnetic field is decreased thereafter to the left, the magnetoresistance element will again achieve the resistance represented by the point 1.

If the magnetic field is increased in the other direction, to the left, (or decreases further for the case when the crossing of the axes is not at zero magnetic field) the magnetoresistance element will achieve a resistance represented by a point 2. If the magnetic field is increased thereafter to the right, the magnetoresistance element will achieve a resistance represented by the point 3, and not by the point 1. Thus, at a magnetic field represented by the points 1 and 3 (or at other points), there is an uncertainty as to the magnetic field being experienced by the magnetoresistance element. In particular, two different resistances, for example, those represented by points 1 and 3, are both indicative of the same magnetic field.

It will be recognized that if the magnetic field is increased to the right further, the magnetoresistance element will again achieve a resistance represented by the point 4. From the point 4, if the magnetic field is decreased to the left, the magnetoresistance element will achieve a resistance represented by the point 1. Thus, it will be appreciated that the curve 12 is traversed in a counter clockwise direction.

In view of the above discussion, it will be apparent that, if the magnetoresistance element achieves a resistance represented by either the point 2 or the point 4, it is deterministic on which one of the two linear regions 12a or 12b the magnetoresistance element will thereafter operate. Therefore, in discussion below, the term "reset" is used to describe a forcing of the magnetoresistance element to achieve either a resistance represented by the point 2 or by the point 4 by application of a reset magnetic field to the magnetoresistance element in one direction or the other, generally along a maximum response axis of the magnetoresistance element.

If operation on the linear region 12a is desired, then the reset forces the magnetoresistance element to a resistance represented by the point 4. This reset is only needed if the magnetoresistance element becomes saturated to the saturation region 12e, and is not needed if the magnetoresistance element becomes saturated to the saturation region 12h. Similarly, if operation on the linear region 12b is desired, then the reset forces the magnetoresistance element to a resistance represented by the point 2. This reset is only needed if the magnetoresistance element becomes saturated to the saturation region 12h, and is not needed if the magnetoresistance element becomes saturated to the saturation region 12e.

In some embodiments, a reset operates in two directions, first forcing the magnetoresistance element to the point 2 then to the point 4 or vice versa. With these arrangements, it will be deterministic as to which linear region 12a or 12b the magnetoresistance element operates on thereafter.

A point 2' is a point near to or on the transition region 12d and a point 4' is a point near to or on the transition region 12f.

The above described increases and decreases of a magnetic field experienced by the magnetoresistance element, which result in transitions about the hysteresis curve 12, are often portrayed in terms of the magnetic field being generally aligned with a maximum response axis of the magnetoresistance element. However, a similar resistance offset of the magnetoresistance element can also come about by way of the magnetic field not being generally aligned with a maximum response axis of the magnetoresistance element, for example, the magnetic field can be perpendicular to the maximum response axis. When this occurs, the magnetoresistance element can be reset in the way described above and below, by temporary application of a relatively large magnetic field along the maximum response axis.

Figure 1A:
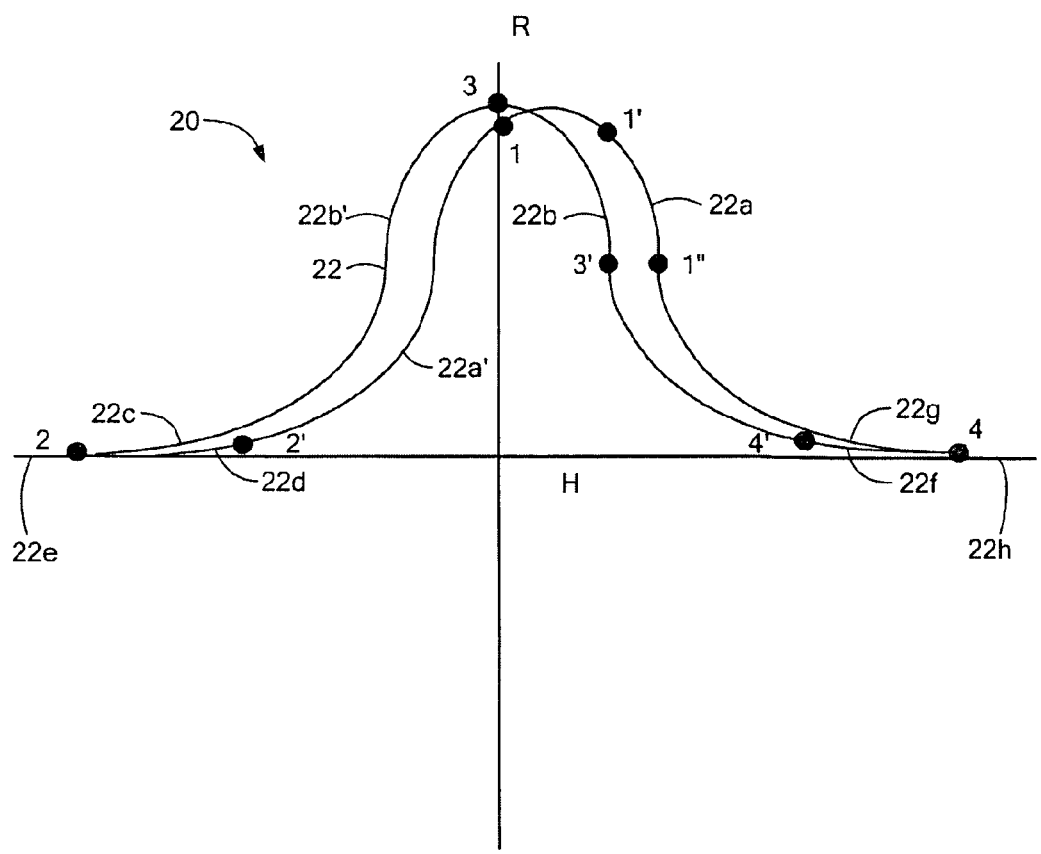
FIG. 1A is a graph showing an exemplary hysteresis characteristic associated with another type of magnetoresistance element.

Referring now to FIG. 1A, in which like points 1, 2, 3, 4, 2', 4' of FIG. 1 are again shown, a graph 20 has a horizontal axis with units of applied magnetic field, or H, which may be provided, for example, in units of Oersteds, and a vertical axis with a scale in units of resistance, or R, which may be provided, for example, in units of Ohms. A curve 22 is representative of a hysteresis characteristic of some other types of magnetoresistance elements, for example, a giant magnetoresistance element The curve 22 has relatively flat saturation regions 22e, 22h, in which the magnetoresistance element associated with the curve 22 experiences high magnetic fields, and relatively straight linear regions 22a, 22b separated from the saturation region 22h by transition regions 12f, 12g. It will be recognized that there are other linear regions 22a', 22b' on the curve 22, which are separated by transition regions 22c, 22d from the saturation region 22e. However, in operation, the type of magnetoresistance element represented by the curve 22 is generally biased to one side or the other to operate in either of the linear regions 22a, 22b or in either of the linear regions 22a', 22b'.

When the magnetoresistance element associated with the curve 22 experiences a nominal (or zero) magnetic field, for example, at the crossing of the two axes, the resistance of the magnetoresistance element can be a resistance represented by either point 1 or point 3. If the magnetoresistance element is biased, for example, to the right, the resistance of the magnetoresistance element can be a resistance represented by either point 1' or point 3'. Presuming that the resistance is at the point 1', if the magnetic field increases to the right, the magnetoresistance element will achieve a resistance represented by the point 4. If the magnetic field is decreased thereafter to the left, the magnetoresistance element will again achieve the resistance represented by the point 1'.

If the magnetic field is increased in the other direction (or decreased further for the case when the crossing of the axes is not at zero magnetic field) the magnetoresistance element will achieve a resistance represented by the point 2. If the magnetic field is increased thereafter to the right, the magnetoresistance element will achieve a resistance represented by the point 3', and not by the point 1'. Thus, at a magnetic field represented by the points 1' and 3' (or at other points, e.g., 1, 3), there is an uncertainty as to the magnetic field being experienced by the magnetoresistance element. In particular, two different resistances, those represented by points 1' and 3' (or 1 and 3), are both indicative of the same magnetic field.

It will be recognized that if the magnetic field is increased to the right further, the magnetoresistance element will again achieve a resistance represented by the point 4. From the point 4, if the magnetic field is decreased to the left, the magnetoresistance element will achieve a resistance represented by the point 1.

The discussion above also applies where point 1 is substituted for the point 1' and point 3 is substituted for the point 3'. However, the points 1' and 3' are points to which a magnetoresistance element having the hysteresis characteristic 22 can be biased so as to operate in the linear regions 22a, 22b.

In view of the above discussion, it will be apparent that, if the magnetoresistance element achieves a resistance represented by either the point 2 or the point 4, it is deterministic on which one of the two linear regions 22a or 22b (or 22a', 22b') the magnetoresistance element will thereafter operate. Therefore, as described above, the term "reset" is used herein to describe a forcing of the magnetoresistance element to achieve either the point 2 or the point 4 by application of a reset magnetic field to the magnetoresistance element in one direction or the other.

If operation on the linear region 22a is desired, then the reset forces the magnetoresistance element to the point 4. This reset is only needed if the magnetoresistance element becomes saturated to the saturation region 22e, and is not needed if the magnetoresistance element becomes saturated to the saturation region 22h. Similarly, if operation on the linear region 22b is desired, then the reset forces the magnetoresistance element to the point 2. This reset is only needed if the magnetoresistance element becomes saturated to the saturation region 22h, and is not needed if the magnetoresistance element becomes saturated to the saturation region 22e.

In some embodiments, a reset operates in two directions, first forcing the magnetoresistance element to the point 2 then to the point 4 or vice versa. With these arrangements, it will be deterministic as to which linear region 22a or 22b the magnetoresistance element operates on thereafter.

A point 2' is a point near to or on the transition regions 22d and a point 4' is a point near to or on the transition region 22f.

The curves 12, 22 of FIGS. 1 and 1A, respectively, are representative of hysteresis characteristics of particular types of magnetoresistance elements. It will be appreciated that other types of magnetoresistance elements may have other forms of hysteresis characteristics. However, the concepts described above apply equally well to magnetoresistance elements having those other types of hysteresis characteristics.

Figure 2:
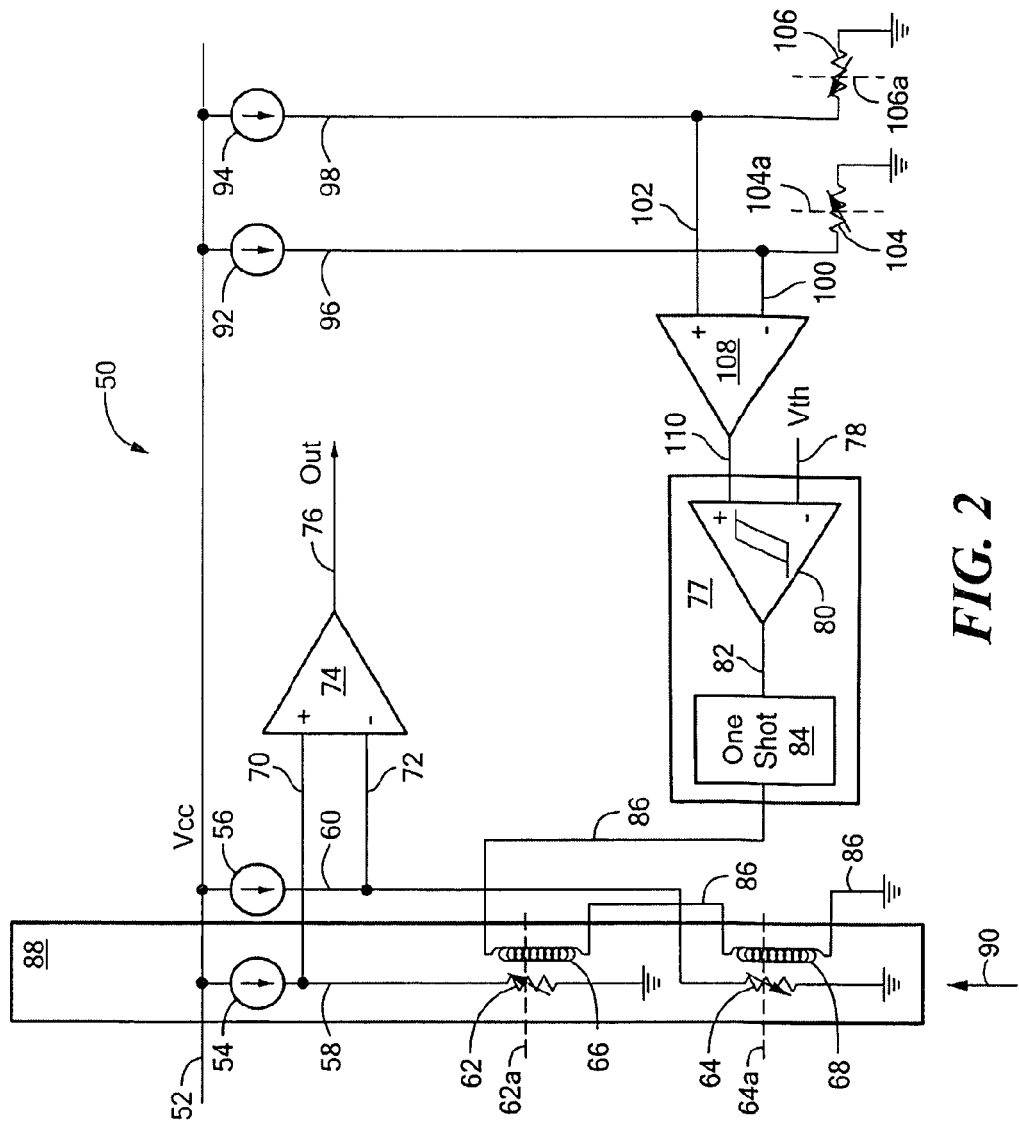
FIG. 2 is a block diagram showing an exemplary sensor, here a current sensor, having a primary magnetoresistance element, here two primary magnetoresistance elements, and a secondary magnetic field sensing element, here two secondary magnetoresistance elements, the sensor configured in an open loop arrangement, the sensor having a reset conductor and also having a comparison circuit.

Referring to FIG. 2, an exemplary electronic circuit 50 includes a primary magnetoresistance element, here two primary magnetoresistance elements 62, 64, for providing a first output signal 76 proportional to a magnetic field. In some embodiments, the circuit 50 is a current sensor and the sensed magnetic field is generated by a current 90 carried by a current-carrying conductor 88. The primary magnetoresistance elements 62, 64 have primary maximum response axes 62a, 64a, respectively. The primary magnetoresistance elements 62, 64 also have a hysteresis characteristic, for example one of the hysteresis characteristics represented by the curves 12, 22 of FIGS. 1 and 1A, respectively.

The electronic circuit 50 also includes a reset conductor, here two reset conductors 66, 68, disposed proximate to the primary magnetoresistance elements 62, 64, respectively. The electronic circuit 50 also includes a secondary magnetic field sensing element, here two secondary magnetoresistance elements 104, 106, for providing a second output signal 110 proportional to a magnetic field. The secondary magnetoresistance elements 104, 106 have respective secondary maximum response axes 104a, 106a. The electronic circuit 50 also includes a comparison circuit 77 coupled to receive the second output signal 110, configured to compare the second output signal 110 to a threshold signal 78, and configured to generate a reset current 86 carried by the reset conductors 66, 68 in response to the comparison. In response to the reset current 86, the reset conductors 66, 68 are configured to generate reset magnetic fields at the primary magnetoresistance elements 62, 64 to temporarily force the magnetoresistance elements 62, 64 to a saturation region of the hysteresis characteristic.

In some embodiments, the secondary maximum response axes 104a, 106a are substantially perpendicular to the primary maximum response axes 62a, 64a. However, other arrangements of the primary and secondary response axes are also possible.

In some embodiments, the reset conductors 66, 68 are coils as shown. In other embodiments, the reset conductors 66, 68 are straight conductors passing proximate to, for example, under or over, the primary magnetoresistance elements 62, 64. The reset conductors 66, 68 can be foxed, for example, on a substrate associated with the magnetoresistance elements 62, 64.

The primary magnetoresistance element 62 carries a current 58 generated by a current source 54 and the primary magnetoresistance element 64 carries a current 60 generated by a current source 56. The secondary magnetoresistance element 104 carries a current 96 generated by a current source 92 and the secondary magnetoresistance element 104 carries a current 98 generated by a current source 94.

In the embodiment shown, the two primary magnetoresistance elements 62, 64 are the same type of magnetoresistance elements but are arranged in opposite directions represented by arrows in opposite directions on the two primary magnetoresistance elements 62, 64. With this arrangement, in response to the current 90 flowing in one direction, one of the two primary magnetoresistance elements 62, 64 increases in resistance, and the other one of the two primary magnetoresistance elements 62, 64 has the opposite response and decreases in resistance, resulting in a differential signal 70, 72, which can be a differential voltage signal. The differential signal 70, 72 is received by an amplifier 74, which generates the first output signal 76.

It will be appreciated that a similar effect can be achieved, namely two magnetoresistance elements that have opposite responses to a magnetic field, by fabricating the two primary magnetoresistance elements 62, 64 in different ways so as to have different polarities.

In the embodiment shown, the two secondary magnetoresistance elements 102, 104 are the same type of magnetoresistance elements but are arranged in opposite directions represented by arrows in opposite directions on the two secondary magnetoresistance elements 102, 104. With this arrangement, in response an external magnetic field in one direction, one of the two secondary magnetoresistance elements 102, 104 increases in resistance, and the other one of the secondary magnetoresistance elements 102, 104 decreases in resistance, resulting in a differential signal 100, 102, which can be a differential voltage signal. The differential signal 100, 102 is received by an amplifier 108, which generates the second output signal 110.

In some embodiments, the comparison circuit 77 can include a comparator 80 coupled to receive the second output signal 110 and coupled to receive the threshold signal 78. The comparator 80 is configured to generate a comparison signal 82, which has two states, a first state indicative of the second output signal 110 being greater than the threshold signal 78 and a second state indicative of the second output signal 110 being less than the threshold signal 78.

A monostable multivibrator circuit 84 (also referred to as a one shot circuit) is coupled to receive the comparison signal 82 and to generate the reset current, which is a temporary current. In one particular embodiment, the reset current is about ten to seventy mA, for a period of about 0.1 to one hundred milliseconds. In one particular embodiment, the reset current is about thirty-five mA for a period of about one millisecond.

It will be apparent that, depending upon which transition of the comparison signal 82, low to high or high to low, causes the one shot circuit 84 to trigger, therefore generating the reset current 86, and also depending upon a value of the threshold signal 78, the reset current 86 can either be generated at a time when the second output signal 110 is greater than the threshold signal 78, at a time when the second output signal 110 is less than the threshold signal 78, at a time when the second output signal 110 is first greater than the threshold signal 78 and then less then the threshold signal 78, or at a time when the second output signal 110 is first less than the threshold signal 78 and then greater than the threshold signal 78. It will be recognized that is many situations, it is advantageous for the reset current 86 to be generated not when the secondary magnetoresistance elements 104, 106 first experience a relatively large magnetic field, but instead when the secondary magnetoresistance elements 104, 106 first experience and then do not experience the relatively large magnetic field.

In some embodiments, the electronic circuit 50 can reset the two primary magnetoresistance elements 62, 64 only after the secondary magnetoresistance elements 104, 106 experience a magnetic field having sufficient magnitude in one direction generally parallel to the secondary response axes 104a, 106a, but not in the other parallel direction. However, in other embodiments, the electronic circuit 50 can reset the two primary magnetoresistance elements 62, 64 after the secondary magnetoresistance elements 104, 106 experience a magnetic field having sufficient magnitude in either direction generally parallel to the secondary response axes 104a, 106a.

As described above, in the embodiment shown, the primary magnetoresistance elements 62, 64 are arranged in opposite directions and thus respond in opposite directions to the same direction magnetic field. In some embodiments, the reset magnetic field presented by the reset conductors 66, 68 to the primary magnetoresistance elements 62, 64, respectively, are in the same directions and parallel to the primary maximum response axes 62a, 64a. However, in some other embodiments, the reset magnetic field presented by the reset conductors 66, 68 to the primary magnetoresistance elements 62, 64, respectively, are in opposite directions and parallel to the primary maximum response axes 62a, 64a.

After the secondary magnetoresistance elements 104, 106 experience a magnetic field having sufficient magnitude and after the magnetic field is gone, both of the primary magnetoresistance elements 62, 64 can be reset. The reset magnetic fields can result in the first one of the primary magnetoresistance elements 62, 64 achieving, for example, the point 2 on the hysteresis curve 12 of FIG. 1 and the second one of the primary magnetoresistance element 62, 64 achieving, for example, the point 4.

As described above in conjunction with FIGS. 1 and 1A, it will be appreciated that, after the reset current 86 is applied and then removed, because the primary magnetoresistance elements 62, 64 are oriented in opposite directions, the two primary magnetoresistance elements 62, 64 will be operating on different ones of the linear regions (e.g., 12a, 12 of FIG. 1) of a hysteresis characteristic (e.g., 12 of FIG. 1). This outcome is deterministic and merely results in an offset of the first output signal 76. The offset can be eliminated by electronic means as will be understood.

In some embodiments, there is no current-carrying conductor 88, and the resulting circuit is used to sense magnetic fields, as would be generated, for example, by passing alternating magnetic domains of a rotating segmented ring magnet. Such an arrangement can be used, for example, in automotive applications, in order to sense a speed of rotation of a crankshaft, a camshaft, or a transmission gear.

In some other embodiments, the two primary magnetoresistance elements 62, 64 can be oriented in the same direction and the current-carrying conductor 88 can pass by each one of the magnetoresistance elements 62, 64 in opposite directions.

In some other embodiments, there are more than two magnetoresistance elements, for example, four magnetoresistance elements in a Wheatstone bridge arrangement. In other embodiments, there is only one magnetoresistance element. In the case of an embodiment having only one magnetoresistance element, it may be desirable to also have a temperature transducer to determine if changes are caused by temperature coefficient of resistance changes, or by a magnetic field. In this case the current sensor 50 may be calibrated at various temperatures and the resistance changes stored in an internal memory bank, for example an EPROM storage cell on an integrated circuit in the sensor.

Figure 2A:
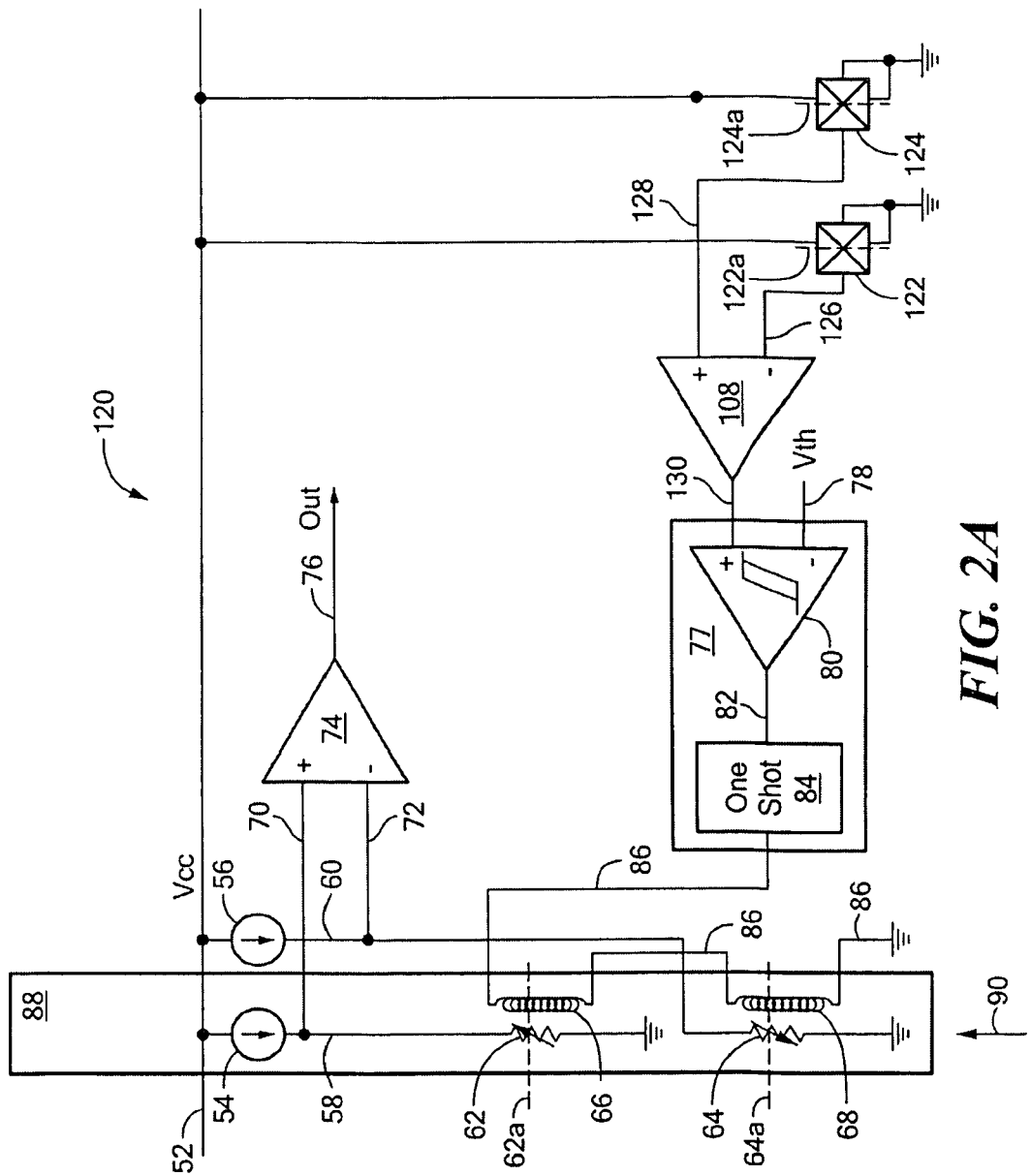
FIG. 2A is a block diagram showing another exemplary sensor, here a current sensor, having a primary magnetoresistance element, here the two primary magnetoresistance elements of FIG. 2, and a secondary magnetic field sensing element, here two secondary Hall effect elements, the sensor configured in an open loop arrangement, the sensor having a reset conductor and also having the comparison circuit of FIG. 2.

Referring now to FIG. 2A, in which like elements of FIG. 2 have like reference designations, an electronic circuit 120 includes two secondary magnetic field sensing elements in the form of two Hall effect elements 122, 124 in place of the two secondary magnetoresistance elements 104, 106 of FIG. 2. The two Hall effect elements 122, 124 have maximum response axes 122a, 124a, respectively, which can have an orientation as shown, which is similar to the orientation of the two secondary maximum response axes 104a, 106a of FIG. 2. It will be appreciated that, in some embodiments, the two Hall effect elements 122, 124 can be vertical Hall effect elements. However, in other embodiments, the two Hall effect elements 122, 124 can be planar Hall effect elements, which can have maximum response axes also perpendicular to the primary maximum response axes 62a, 64a, but, for example, perpendicular to the page of FIG. 2A.

As is known, Hall effect elements are generally four terminal devices, configured to receive a DC voltage signal, for example the Vcc signal 52, and configured to generate output voltage signals, for example, signals 126, 128. Thus, the current sources 92, 94 of FIG. 2 are not needed.

Operation of the electronic circuit 120 is essentially the same as that described above in conjunction with FIG. 2A, and is not described again.

In some embodiments, the two Hall effect elements 122, 124 can be integrated onto a common circuitry die with other circuit elements, for example, with the amplifier 106, the amplifier 74, the current sources 54, 56, and/or the comparison circuit 77.

While current sensors using primary magnetoresistance elements are described as examples above, it will be appreciated that the above circuits and techniques can also be used with external magnetic field sensors and also with electrical signal isolators.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:
1. An electronic circuit, comprising:
a primary magnetoresistance element for providing a first output signal proportional to a magnetic field, wherein the primary magnetoresistance element has a primary maximum response axis, wherein the primary magnetoresistance element has a hysteresis characteristic;
a reset conductor disposed proximate to the magnetoresistance element;
a secondary magnetic field sensing element for providing a second output signal proportional to a magnetic field, wherein the secondary magnetic field sensing element has a secondary maximum response axis; and
a comparison circuit coupled to receive the second output signal, configured to compare the second output signal to a threshold signal, and configured to generate a reset current carried by the reset conductor in response to the comparison, wherein, in response to the reset current, the reset conductor is configured to generate a reset magnetic field at the primary magnetoresistance element to temporarily force the magnetoresistance element to a saturation region of the hysteresis characteristic.

2. The electronic circuit of claim 1, wherein the secondary maximum response axis is substantially perpendicular to the primary maximum response axis.

3. The electronic circuit of claim 1, wherein the primary magnetoresistance element comprises a giant magnetoresistance element.

4. The electronic circuit of claim 1, wherein the primary magnetoresistance element comprises two primary magnetoresistance elements.

5. The electronic circuit of claim 4, wherein the two primary magnetoresistance elements have opposite polarities.

6. The electronic circuit of claim 4, wherein the reset magnetic field is generated so as to temporarily force one of the two primary magnetoresistance elements to a highest resistance and the other one of the two primary magnetoresistance elements to a lowest resistance.

7. The electronic circuit of claim 4, wherein the reset magnetic field is generated so as to temporarily force both of the two primary magnetoresistance elements to a highest resistance or to a lowest resistance.

8. The electronic circuit of claim 1, further comprising a current carrying conductor disposed proximate to the primary magnetoresistance element, wherein the first output signal is proportional to a sensed current magnetic field generated by a current carried by the current carrying conductor, wherein the electronic circuit is configured as a current sensor.

9. The electronic circuit of claim 1, wherein the reset conductor comprises a coil.

10. The electronic circuit of claim 1, wherein the comparison circuit comprises:
a comparator coupled to receive the output signal, coupled to receive the threshold signal, and configured to generate a comparison signal; and
a monostable multivibrator coupled to receive the comparison signal and configured to generate the reset current.

11. The electronic circuit of claim 1, wherein the secondary magnetic field sensing element comprises a secondary magnetoresistance element.

12. The electronic circuit of claim 1, wherein the secondary magnetic field sensing element comprises a secondary Hall effect element.

13. The electronic circuit of claims 12, wherein the Hall effect element is disposed on a substrate die with at least one amplifier.

14. The electronic circuit of claim 1, wherein the hysteresis characteristic is a function of resistance versus an applied magnetic field and a graph of the hysteresis characteristic has a parallelogram shape.

15. The electronic circuit of claim 1, wherein the hysteresis characteristic is a function of resistance versus an applied magnetic field and a graph of the hysteresis characteristic has a shape comprising two coupled curves.

16. A method of resetting a primary magnetoresistance element having a primary maximum response axis and a hysteresis characteristic, comprising:
sensing a magnetic field with a secondary magnetic field sensing element having a secondary maximum response axis;
comparing the magnetic field sensed by the secondary magnetic field sensing element to a threshold; and
resetting the primary magnetoresistance element with a reset magnetic field in response to the comparing by temporarily forcing the primary magnetoresistance element to a saturation region of the hysteresis characteristic.

17. The method of claim 16, wherein the secondary maximum response axis is substantially perpendicular to the primary maximum response axis.

18. The method of claim 16 wherein the primary magnetoresistance element comprises a giant magnetoresistance element.

19. The method of claim 16 wherein the primary magnetoresistance element comprises two primary magnetoresistance elements.

20. The method of claim 19 wherein the two primary magnetoresistance elements have opposite polarities.

21. The method of claim 19, wherein the reset magnetic field is generated so as to temporarily force one of the two primary magnetoresistance elements to a highest resistance and the other one of the two primary magnetoresistance elements to a lowest resistance.

22. The method of claim 19, wherein the reset magnetic field is generated so as to temporarily force both of the two primary magnetoresistance elements to a highest resistance or to a lowest resistance.

23. The method of claim 16, further comprising:
sensing a magnetic field generally parallel to the primary maximum response axis with the primary magnetoresistance element, wherein the magnetic field generally parallel to the primary maximum response axis is generated in response to a sensed current carried by a current-carrying conductor.

* * * * *

UNITED STATES PATENT AND TRADEMARK OFFICE
CERTIFICATE OF CORRECTION

| | | |
|---|---|---|
| PATENT NO. | : 8,063,634 B2 | Page 1 of 1 |
| APPLICATION NO. | : 12/183106 | |
| DATED | : November 22, 2011 | |
| INVENTOR(S) | : John Sauber et al. | |

It is certified that error appears in the above-identified patent and that said Letters Patent is hereby corrected as shown below:

Column 6, line 1, delete "above described" and replace with --above-described--.

Column 6, line 3, delete "result" and replace with --results--.

Column 7, line 32, delete "regions" and replace with --region--.

Column 8, line 14, delete "foxed" and replace with --formed--.

Column 8, line 47, delete "response an" and replace with --response to an--.

Column 9, line 13, delete "less then" and replace with --less than--.

Column 9, line 16, delete "that is" and replace with --that in--.

Column 9, line 52, delete "element" and replace with --elements--.

Signed and Sealed this
Twenty-sixth Day of June, 2012

David J. Kappos
*Director of the United States Patent and Trademark Office*